United States Patent [19]

McGowan, Jr.

[11] 4,369,063

[45] Jan. 18, 1983

[54] SILVER CONTAINING CONDUCTIVE COATINGS

[75] Inventor: Earsel McGowan, Jr., Washington, Pa.

[73] Assignee: Ciba-Geigy Corporation, Ardsley, N.Y.

[21] Appl. No.: 320,245

[22] Filed: Nov. 12, 1981

[51] Int. Cl.³ .............................................. C09D 5/24
[52] U.S. Cl. .................................. 106/1.14; 106/1.19; 252/514
[58] Field of Search ........................ 106/1.14, 1.19; 252/514

[56] References Cited

U.S. PATENT DOCUMENTS 3,849,142 11/1974 Conwicke .......................... 106/1.14
3,917,487 11/1975 Short .................................. 106/1.14

*Primary Examiner*—Lorenzo B. Hayes
*Attorney, Agent, or Firm*—Harry Falber

[57] ABSTRACT

Conductive coating compositions comprising particulate silver metal, a glass frit system, a selenium component, a vehicle for said composition and various optional ingredients, said conductive compositions being applicable for use as heating elements, printed circuits, and the like.

12 Claims, No Drawings

SILVER CONTAINING CONDUCTIVE COATINGS

Conventional silver containing conductive coatings generally consist of a particulate metal in a glass frit system. This conventional silver and glass system may contain various elements as modifiers to enhance properties such as bond strength, solderability and abrasion resistance. Sulfur-containing compounds, such as silver sulfate, copper sulfate, silver sulfide, to name just a few, are frequently added in order to "stain" glass substrates when said compositions are applied thereto, i.e. create a dark appearance when viewing the applied coating through the glass. These compositions are also dispersed in a vehicle suitable for the intended area of application. For example, pine oil-based vehicles are frequently utilized for screen printing applications.

Such conventional systems suffer from a number of distinct disadvantages. Initially, conventional stained conductive coatings tend to react chemically when in contact with sulfur-containing materials such as vulcanized rubber and related products, products which are frequently encountered when these materials are utilized for automotive purposes. For example, such reactivity degrades rubber window seals. A significant amount of such chemical reactivity is, accordingly, unacceptable. Likewise, undesirable discoloration of the non-adhered silver surface is frequently encountered. Due to the above noted difficulties, it is far more convenient to prepare unstained coatings, i.e. coatings that provide merely a straw colored appearance. However, the appealing, less obvious dark brown or dark red brown color of stained formulations is sacrificed. The large amounts of staining agent generally utilized in conventional stained coatings in order to attain the desired color also limit the degree of conductivity achieved therewith. Thus, since the concentrations of staining agent and silver are inversely proportional, added amounts of staining agent necessarily reduce the level of available silver conductor. Finally, the possibility of undesirable gel formation with various vehicles is also to be considered. Reversal or prevention of such gel formation is both expensive and time-consuming. It is therefore seen that both the stained and unstained prior art formulations suffer from restricted performance characteristics and reduced flexibility of use.

It is the primary object of this invention to provide a novel class of stained silver containing conductive coatings.

It is a further object to provide such coatings which exhibit substantially improved performance characteristics.

It is another object to provide conductive coatings which eliminate the undesirable ingredients of prior art formulations.

It is still another object to provide conductive coatings which exhibit excellent flexibility in terms of properties and areas of use.

Various other objects and advantages of this invention will become evident from the following description thereof.

It has now been surprisingly discovered that by substituting selenium or selenium containing compounds for the conventional sulfur-containing compounds normally presented in stained silver conductive coatings, the difficulties encountered with the prior art formulations are substantially overcome. Thus, such conductive coatings exhibit a dark brown or dark red brown appearance, when viewed through glass after firing. The dark color provides an appealing, less obvious appearance, particularly desirable when such compositions are utilized as defrost circuits for automotive backlights (rear windows). Furthermore, the replacement of the sulfur-containing compounds substantially minimizes the potential for the aforementioned gelling problem. Since reduced amounts of selenium compound are needed in order to achieve comparable staining levels, greater flexibility in terms of the degree of conductivity is achieved. Thus, by being able to include increased concentrations of silver, higher conductivity can be attained. With this flexibility in terms of adjusting the electrical resistance of the conductive coatings, a wide variety of applications becomes available. For example, a larger variety of backlights can be produced. Finally, the instant compositions exhibit only minimal amounts of chemical reactivity when in contact with sulfur containing materials such as vulcanized rubber. Accordingly, it is noted that the conductive coatings of this invention provide a myriad of improved performance characteristics as well as increased flexibility in terms of areas of use.

The silver containing conductive coatings of the invention contain, as the primary ingredients, silver metal, glass frit, selenium component and vehicle. The silver metal is in particulate form, either as flake, powder or a combination of the two. The presence of the metallic silver provides a continuous conductor for passage of the electric current.

Any conventional soft glass frit can be utilized in the instant formulations. The frit will generally be ground to pass through 325 mesh screen (U.S. Standard Sieve size). The primary purpose of the frit is to bond the silver to the indicated substrate without interfering with the conductivity, i.e. the silver-silver interchange. The frit may comprise any appropriate combination of metal oxides. Typical oxides may be selected from the oxides of zinc, lead, silicon, titanium, zirconium, sodium, boron, lithium, potassium, calcium, aluminum, tin, vanadium, molybdenum, magnesium, iron, manganese and the like. Correspondingly, various fluorides may appear in the frit. The batch composition which will provide the above noted oxides and fluorides may contain various salts, such as oxides, carbonates, sulfates, nitrates, fluorides and the like, of the above noted metals. The batch ingredients are selected in order to achieve predetermined frit properties. Lead borosilicate frits are preferred for purposes of this invention.

The frit is prepared by melting the batch ingredients at temperatures of from about 900° to 1600° C. and then quenching the molten glass either with the use of water or by pouring the melt between two cooled metal rolls rotating in opposite direction. Melting generally is conducted in a ceramic or platinum crucible or in an appropriately lined furnace. The resulting chips, chunks or flakes of frit are then ground into fine particles.

The selenium component will comprise metallic selenium or a selenium containing compound. Typical compounds include selenides and selenates such as copper, zinc, cadmium, lead, barium, mercury, antimony, arsenous, nickel and cobalt selenides and barium selenate; sulfur-selenide complexes such as cadmium sulfur selenide; and metal selenide complexes such as cadmium aluminum selenide, zinc indium selenide, copper chromium selenide and copper chromium selenium chloride. The sulfur selenium alloys preferably in pigment form are preferred for purposes of this invention.

The vehicle is selected on the basis of the end use application. It is essential that the vehicle adequately suspend the particulates and burn off completely upon firing of the composition. Vehicles are typically organic and include pine oils, vegetable oils, mineral oils, low molecular weight petroleum fractions, and the like. The vehicles may be modified by viscous resins such as vinyl resins, solvents, film formers such as cellulosic materials, and the like.

The conductive coatings contain from about 45–90%, by weight, of silver and preferably 50 to 82%; from about 1.5 to 25%, by weight, glass frit and preferably 2 to 20%; from about 0.5 to 15%, by weight, selenium component and preferably 1 to 3%, and from 5 to 50%, by weight, vehicle and preferably 7 to 22%. The resulting compositions will be viscous in nature, the viscosity depending on application method and end use. For purposes of screen printing, viscosities ranging from 10,000–80,000, and preferably 35,000–65,000, centipoises at 20° C. as determined on a Brookfield Viscometer, #7 spindle at 20 rpm are appropriate.

A wide variety of optional ingredients may be included in these formulations. These may be included in order to modify viscosity and electrical resistance or to enhance properties such as bond strength, solderability and abrasion resistance. Typical ingredients include bismuth and bismuth-containing compounds for bond strength and increased solder pull; certain refractory materials such as zirconium oxide to enhance abrasion resistance; suspending agents such as iso-stearic acid; and fumed silica and other silica products to modify viscosity. It is also possible to replace part of the total silver content by particulate metals of higher resistivity, thereby reducing, if desired, the overall conductivity of the conductive coating. Such metals include nickel, copper, nickel-chromium and the like.

The conductive compositions are prepared by blending the solid materials, adding the liquid ingredients thereto and then thoroughly mixing or kneading the two in order to form a smooth, thick paste. The paste is then further dispersed by means of a conventional machine such as a three-roll mill or dispersator such as a Cowles or Morehouse mill.

Methods for applying the conductive coatings are well known to those skilled in the art. The dispersed compositions may be applied by techniques such as screen printing, decal application, spraying, brushing, roller coating, and the like. Screen printing is preferred for purposes of applying the composition to glass substrates. The applied coating is then fired to bond the metallic silver to the glass substrate. The firing temperature will be determined on the basis of the frit maturing temperature. However, for automotive purposes, the temperature will conform to the temperature of the glass tempering cycle, i.e. from about 630° to 760° C. Firing temperatures for non-glass applications will generally range from 450° to 875° C. If more than one application of conductive coating is required, it is possible to merely dry the first application, apply a second layer and then fire the total coating.

The fired coating provides a continuous conductor for electrical current. It is dark brown or dark red brown in color when viewed through glass to provide an attractive, unobtrusive pattern. The stain is most apparent when the coating is applied to float glass, i.e. glass formed on a molten tin bed. As previously noted, the instant conductive coatings are applicable for use in a variety of end use applications. Thus, they can be used as defrost heating elements for rear windows, as heating elements for warming trays, as conductive elements for touch panels, in printed circuits for electronic applications, and for the manufacture of electronic components such as resistors and capacitors.

The following examples further illustrate the embodiments of this invention. In these examples, all parts are given by weight unless otherwise specified.

EXAMPLE 1

This example illustrates the preparation of typical conductive coatings of the instant invention.

The following ingredients were utilized

|  | parts | |
|---|---|---|
|  | A | B |
| Silver Powder | 80.67 | 72.00 |
| Glass Frit (1) | 2.56 | 8.74 |
| Glass Frit (2) | — | 0.87 |
| Selenium Material (3) | 3.00 | 1.70 |
| Vehicle (4) | 10.08 | — |
| Vehicle (5) | — | 14.06 |
| $Bi_2O_3$ | — | 0.43 |
| Wetting Agent (6) | 1.02 | — |
| Anti-gelling Agent (7) | 1.32 | 1.29 |
| Iso-stearic acid | 1.35 | 0.91 |

(1) Glass Frit

|  | parts |
|---|---|
| PbO | 78.2 |
| $SiO_2$ | 11.6 |
| $B_2O_3$ | 10.2 |

(2) Glass Frit

|  | parts |
|---|---|
| PbO | 38.8 |
| $SiO_2$ | 5.4 |
| $H_3BO_3$ | 11.6 |
| $Bi_2O_3$ | 28.7 |
| $Li_2CO_3$ | 11.6 |
| $Na_2CO_3$ | 3.9 |

(3) Cadmium sulfur selenide pigment designated X3450 from CIBA-GEIGY Corporation
(4) Vehicle

|  | parts |
|---|---|
| Pine Oil | 73.9 |
| Ethyl Cellulose | 1.5 |
| Flow Modifier* | 16.8 |
| Vinyl Resin** | 0.3 |
| Ethylene Glycol | 7.5 |

*ABALYN from Hercules Chemical Corp.
**BAKELITE Vinyl Butyral XYSG from Union Carbide
(5) Vehicle

|  | parts |
|---|---|
| Pine Oil | 75.46 |
| Solvent System* | 13.70 |
| Ethyl Cellulose | 2.28 |
| Resin** | 7.22 |
| Flow Modifier | 0.34 |

*VARSOL from EXXON Corp.
**PICCOLASTIC A-25 and A-75 from Hercules Chemical Corp.
(6) BRI-J92 from ICI Americas
(7) BYKANOL-N from Mallinckrodt The coatings were prepared by blending the solid and liquid ingredients into thick smooth pastes. The pastes were then dispersed using a three roll mill. The resulting pastes had Brookfield viscosities of 57,000 and 40,000 centipoises at 20° C., respectively.

The pastes were thereafter screen printed onto float glass substrates in a grid pattern 59.69 cm in length and 0.0762 cm. in width. The coating was fired at 610° C. for 4.5 minutes to produce a dark brown pattern of metallic silver when viewed through the glass. Staining was absent on the opposite surface of the silver coating. The resistances of the respective grid patterns, as determined by a Fluke 8000 A Ohmmeter, were 33.22 ohms/cm. and 105.16 ohms/cm.

EXAMPLE 2

The following coating compositions were prepared utilizing the procedure of Example 1.

|  | parts | | | | | |
|---|---|---|---|---|---|---|
|  | A | B | C | D | E | F |
| Silver powder | 72.00 | 72.00 | 72.00 | 72.00 | 72.00 | 70.85 |
| Glass Frit (1) | 8.81 | 9.60 | 8.73 | 9.26 | 10.03 | 8.60 |
| Glass Frit (2) | 0.88 | 0.88 | 0.87 | 0.87 | — | 0.90 |
| $Bi_2O_3$ | 0.44 | 0.44 | — | — | — | 0.40 |
| Selenium Component (3) | 1.61 | 0.40 | 1.61 | 1.61 | 1.71 | 1.70 |
| Vehicle (4) | 14.06 | 14.06 | 14.06 | 14.06 | 14.06 | 15.07 |
| Anti-Gelling Agent (7) | 1.29 | 1.29 | 1.29 | 1.29 | 1.29 | 1.45 |
| Iso-stearic acid | 0.91 | 0.91 | 0.91 | 0.91 | 0.91 | 1.03 |

|  | parts | | | | | |
|---|---|---|---|---|---|---|
|  | G | H | I | J | K | L |
| Silver Powder | 60.41 | 80.67 | 71.2 | 58.7 | 79.0 | 79.0 |
| Glass Frit (1) | 18.73 | 1.80 | 6.3 | 18.3 | 1.8 | 3.4 |
| Selenium Component (3) | — | — | 1.7 | 1.9 | 3.7 | 2.0 |
| Selenium Powder | 2.00 | 3.76 | — | — | — | — |
| Silica Filler | 0.44 | — | 0.6 | 0.4 | — | — |
| Vehicle (4) | — | 10.08 | — | — | 11.4 | 11.4 |
| Vehicle (5) | 16.14 | — | — | 18.2 | — | — |
| Vehicle (8) | — | — | 17.8 | — | — | — |
| Wetting Agent (6) | — | 1.02 | — | — | 1.1 | 1.1 |
| Anti-Gelling Agent (7) | 1.26 | 1.32 | 1.5 | 1.4 | 1.5 | 1.5 |
| Iso-stearic Acid | 1.02 | 1.35 | 0.9 | 1.0 | 1.5 | 1.6 |

(8) Vehicle

|  | parts |
|---|---|
| Pine Oil | 65.7 |
| Solvent System | 13.7 |
| Ethyl Cellulose | 2.2 |
| Flow Modifier | 0.7 |
| Ethylene Glycol | 0.05 |
| Resin System | 17.65 |

The various formulations were applied to glass according to the procedure of Example 1 and were seen to have good viscosity, electrical and staining properties.

In summary, this invention provides novel silver-containing conductive coating compositions. Variations may be made in procedures, proportions and materials without departing from the scope of the invention as defined by the following claims.

What is claimed is:

1. In a conductive coating composition comprising from about 45-90%, by weight, of silver in particulate form, from about 1.5-25%, by weight, of a glass frit composition, and from about 5-50%, by weight, of a vehicle for said composition the improvement comprising from about 0.5-15%, by weight, of a selenium component.

2. The composition of claim 1, wherein said glass frit comprises a combination of metal oxides.

3. The composition of claim 2, wherein said oxides are selected from the group consisting of zinc, lead, silicon, titanium, zirconium, sodium, boron, lithium, potassium, calcium, aluminum, tin, vanadium, molybdenum, magnesium, iron and manganese oxides.

4. The composition of claim 3, wherein said frit comprises lead oxide, silicon dioxide and boron oxide.

5. The composition of claim 1, wherein said selenium component is selected from metallic selenium, metallic selenide and selenate salts, sulfur-selenium complexes and metal selenide complexes.

6. The composition of claim 5, wherein said selenium component is a cadmium sulfur selenide pigment.

7. The composition of claim 1, wherein an organic vehicle is present.

8. The composition of claim 7, wherein said vehicle is based on pine oil, vegetable oils, mineral oils or low molecular weight petroleum fractions.

9. The composition of claim 8, wherein said vehicle is based on pine oil.

10. The composition of claim 1 which contains 50-82% of silver, 2-20% of glass frit, 1-3% of selenium component and 7-22% of vehicle, all percentages being based on the weight of the composition.

11. The composition of claim 1 which comprises silver, lead borosilicate frit, cadmium sulfur selenide pigment and pine oil-based vehicle.

12. The composition of claim 11 which contains 80.67% silver powder, 2.56% lead borosilicate frit, 3.0% cadmium sulfur selenide pigment, 10.08% pine oil-based vehicle, 1.02% wetting agent, 1.32% anti-gelling agent and 1.35% iso-stearic acid, all percentages being based on weight of the composition.

* * * * *